US012622316B2

(12) United States Patent
Wang et al.

(10) Patent No.: US 12,622,316 B2
(45) Date of Patent: May 5, 2026

(54) SEMICONDUCTOR STRUCTURE OF CELL ARRAY FORMED BY CELLS WITH HYBRID CELL HEIGHTS

(71) Applicant: MEDIATEK INC., Hsinchu City (TW)

(72) Inventors: Wen-Cheng Wang, Hsinchu City (TW); Yung-Chieh Yu, Hsinchu City (TW)

(73) Assignee: MEDIATEK INC., Hsinchu City (TW)

( * ) Notice: Subject to any disclaimer, the term of this patent is extended or adjusted under 35 U.S.C. 154(b) by 775 days.

(21) Appl. No.: 17/512,875

(22) Filed: Oct. 28, 2021

(65) Prior Publication Data

US 2022/0165706 A1 May 26, 2022

Related U.S. Application Data

(60) Provisional application No. 63/213,308, filed on Jun. 22, 2021, provisional application No. 63/116,937, filed on Nov. 23, 2020.

(51) Int. Cl.
*G06F 30/394* (2020.01)
*H01L 25/065* (2023.01)
*G06F 30/392* (2020.01)

(52) U.S. Cl.
CPC ........ *H01L 25/0652* (2013.01); *G06F 30/392* (2020.01); *G06F 30/394* (2020.01)

(58) Field of Classification Search
None
See application file for complete search history.

(56) References Cited

U.S. PATENT DOCUMENTS

| | | | |
|---|---|---|---|
| 7,989,849 | B2 | 8/2011 | Sherlekar et al. |
| 11,106,854 | B2 | 8/2021 | Chuang et al. |
| 2003/0140323 | A1 | 7/2003 | Dono |
| 2009/0230990 | A1 | 9/2009 | Terzioglu et al. |
| 2010/0162187 | A1 | 6/2010 | Penzes et al. |

(Continued)

FOREIGN PATENT DOCUMENTS

| | | | |
|---|---|---|---|
| TW | 202009755 A | 3/2020 | |

OTHER PUBLICATIONS

German language office action dated Oct. 28, 2022, issued in application No. DE 10 2021 129 850.4.

(Continued)

*Primary Examiner* — Sue A Purvis
*Assistant Examiner* — Seyon Ali-Simah Punchbeddell
(74) *Attorney, Agent, or Firm* — McClure, Qualey & Rodack, LLP

(57) ABSTRACT

Semiconductor structures are provided. A semiconductor structure includes a cell array. The cell array includes a plurality of first cells arranged in a first column, a plurality of second cells arranged in a second column abutting the first column and a third cell arranged in the first column. Each first cell has a first cell height and is configured to perform a first function. Each second cell has a second cell height and is configured to perform a second function. The third cell has a third cell height and is configured to perform a third function. Each second cell is coupled to and in contact with a respective first cell. The second cell height is greater than the first cell height, and the number of first cells is equal to the number of second cells. The third cell height is proportional to the first cell height.

20 Claims, 11 Drawing Sheets

100A

(56)            References Cited

U.S. PATENT DOCUMENTS

| | | | | |
|---|---|---|---|---|
| 2019/0286783 A1* | 9/2019 | Yang | ........................ | G03F 1/36 |
| 2020/0065452 A1* | 2/2020 | Chuang | ................ | G06F 30/398 |
| 2020/0134119 A1* | 4/2020 | Sio | ........................... | G03F 1/36 |
| 2020/0328201 A1* | 10/2020 | Li | ...................... | H01L 27/0688 |
| 2020/0365589 A1* | 11/2020 | Liaw | .............. | H01L 21/823821 |
| 2021/0125917 A1* | 4/2021 | Bansal | ................. | G06F 30/392 |
| 2021/0209281 A1* | 7/2021 | Ou | ...................... | G06F 30/3953 |
| 2021/0391850 A1* | 12/2021 | Wang | ................ | H03K 3/35625 |

OTHER PUBLICATIONS

Chinese language office action dated Dec. 6, 2022, issued in application No. TW 110143306.

* cited by examiner

Obtain different cell heights of cells to be arranged in cell array ——S510

Obtain array height of the cell array ——S520

Arrange cells having maximum cell height in first column of cell array ——S530

Arrange cells having other cell heights in other columns of cell array ——S540

Provide interconnect structures between cells in different columns ——S550

SEMICONDUCTOR STRUCTURE OF CELL ARRAY FORMED BY CELLS WITH HYBRID CELL HEIGHTS

CROSS REFERENCE TO RELATED APPLICATIONS

This Application claims priority of U.S. Provisional Application No. 63/116,937, filed on Nov. 23, 2020, and U.S. Provisional Application No. 63/213,308, filed on Jun. 22, 2021, the entirety of which are incorporated by reference herein.

BACKGROUND OF THE INVENTION

Field of the Invention

The invention relates to a cell array, and more particularly to a cell array formed by cells with hybrid cell heights.

Description of the Related Art

Integrated circuits (ICs) have become increasingly important. Applications using ICs are used by millions of people. These applications include cell phones, smartphones, tablets, laptops, notebook computers, PDAs, wireless email terminals, MP3 audio and video players, and portable wireless web browsers. Integrated circuits increasingly include powerful and efficient on-board data storage and logic circuitry for signal control and processing.

With the increasing down-scaling of integrated circuits, the integrated circuits become more compact. For various cells that are frequently used in integrated circuits, when the cell height difference increases, the arrangement of the cells becomes more complicated. Therefore, a cell array with hybrid cell height is desired.

BRIEF SUMMARY OF THE INVENTION

Semiconductor structures are provided. An embodiment of a semiconductor structure is provided. The semiconductor structure includes a cell array. The cell array includes a plurality of first cells arranged in a first column, a plurality of second cells arranged in a second column abutting the first column, and at least one third cell arranged in the first column. Each of the first cells has a first cell height along a first direction and is configured to perform a first function. Each of the second cells has a second cell height along the first direction and is configured to perform a second function. The third cell has a third cell height along the first direction and is configured to perform a third function that is different from the first function and the second function. Each of the second cells is coupled to and in contact with a respective first cell, and configured to receive at least one signal from the respective first cell and provide an output signal according to the received signal. The second cell height is greater than the first cell height, and the number of first cells is equal to the number of second cells. The third cell height is proportional to the first cell height.

Furthermore, an embodiment of a semiconductor structure is provided. The semiconductor structure includes a cell array. The cell array includes a plurality of first cells arranged in a first column, a plurality of second cells arranged in a second column abutting the first column, at least one third cell arranged in the first column, and at least one fourth cell arranged in the second column. Each of the first cells has a first cell height along a first direction and is configured to perform a first function. Each of the second cells has a second cell height along the first direction and is configured to perform a second function. The third cell has a third cell height along the first direction and is configured to perform a third function that is different from the first function. The fourth cell has half of the second cell height along the first direction and is configured to perform a fourth function that is different from the second function. Each of the first cells is coupled to and in contact with a respective second cell, and configured to provide at least one signal to the respective second cell according to an input signal. The second cell height is greater than the first cell height, and the number of first cells is equal to the number of second cells. The third cell height is proportional to the first cell height.

Moreover, an embodiment of a method for providing a cell array is provided. The first cell height of a plurality of first cells and the second cell height of a plurality of second cells are obtained. The second cell height is greater than the first cell height. The array height of the cell array is obtained according to a least common multiple of the first cell height and the second cell height. The second cells are arranged in a first column of the cell array. The first cells are arranged in a second column of the cell array. The number of first cells arranged in the second column is equal to the number of second cells arranged in the first column, and each of the second cells is coupled to and in contact with a respective first cell. At least one first additional cell having a third cell height is arranged in the second column of the cell array. Each of the first cells is configured to perform a first function and each of the second cells is configured to perform a second function that is different from the first function. The third cell height is proportional to the first cell height. Each of the first cells comprises an interconnect structure configured to couple to and in contact with a respective second cell.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Some variations of the embodiments are described. Throughout the various views and illustrative embodiments, like reference numbers are used to designate like elements. It should be understood that additional operations can be provided before, during, and/or after a disclosed method, and some of the operations described can be replaced or eliminated for other embodiments of the method.

Furthermore, spatially relative terms, such as "beneath," "below," "lower," "above," "upper" and the like, may be used herein for ease of description to describe one element or feature's relationship to another element(s) or feature(s) as illustrated in the figures.

Figure 1:
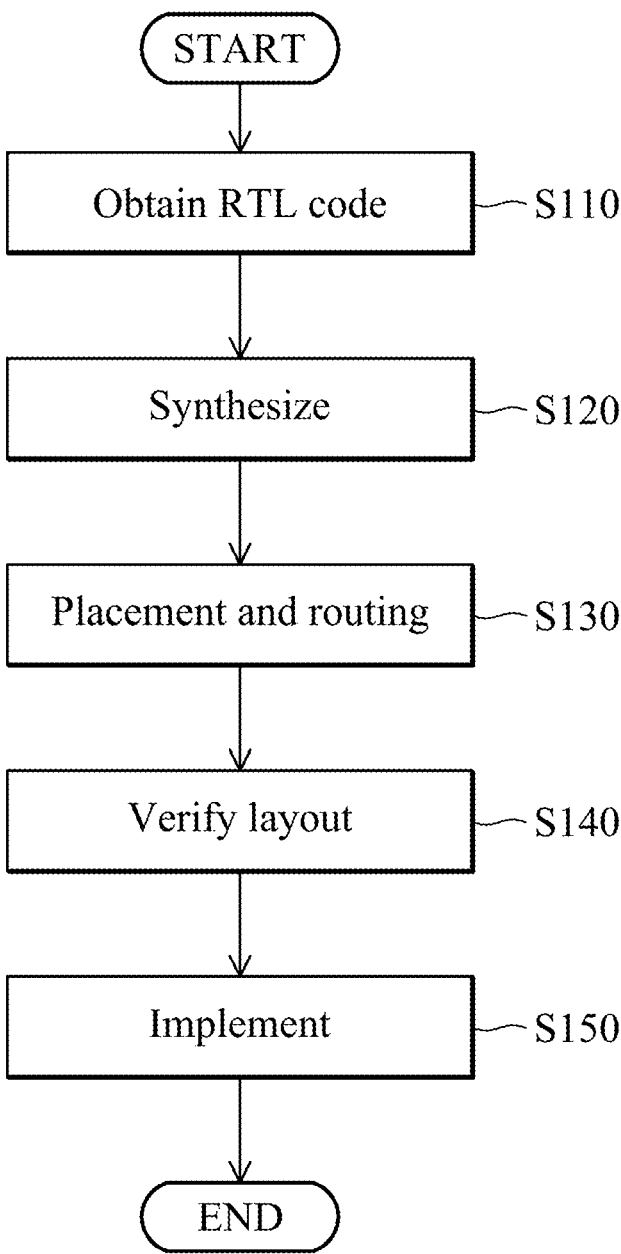
FIG. 1 is a flowchart illustrating a hierarchical design process of an integrated circuit (IC).

FIG. 1 is a flowchart illustrating a hierarchical design process of an integrated circuit (IC). In step S110, a register-transfer level (RTL) code describing the function performed by the IC is obtained. The RTL code may indicate that a design is performed using a language describing hardware, such as a Hardware Description Language (HDL). In step S120, the RTL code is synthesized to generate a netlist including gates (or cells) of the IC. In general, the IC comprises a plurality of blocks, and each block provides a significant function for the IC, such as a specific processor (e.g. an application processor, a video processor, an audio processor, or a controller), a memory (e.g. a SRAM device) and so on. Furthermore, each block has a corresponding RTL code, and then the RTL code of each block is synthesized to generate the corresponding netlist comprising the gates of the block. Before the RTL code is synthesized, a RTL simulation is performed to check the functional correctness of the RTL code. Furthermore, after obtaining the gates of the block in the netlists, a gate level simulation is performed to check the functional correctness of the netlists. In step S130, according to the gates of the blocks in the netlists, a placement and routing procedure is performed to generate a layout of whole blocks within a chip area of the IC. Thus, according to the placements, a chip placement and routing procedure is performed and a layout is obtained. In some embodiments, the layout is a whole chip layout. In some embodiments, the layout is a portion of a whole chip layout regarding some digital or analog circuits of the IC. In step S140, an analysis procedure is performed and the layout is verified to check whether the layout violates any of the various constraints or rules. After the layout is completed, design rule check (DRC), layout versus schematic (LVS) and electric rule check (ERC) are performed. The DRC is a process of checking whether the layout is successfully completed with a physical measure space according to the design rule, and the LVS is a process of checking whether the layout meets a corresponding circuit diagram. In addition, the ERC is a process of for checking whether devices and wires/nets are electrically well connected therebetween. Furthermore, a post-simulation is performed to check the functional completeness of the layout by extracting and simulating a parasitic component, such as a parasitic capacitance. If there are no violations in the layout, the IC is fabricated (or implemented) according to the layout (step S150). If a violation is present in the layout, the layout of the IC must be modified to handle the violation until no violations are present.

Figure 2:
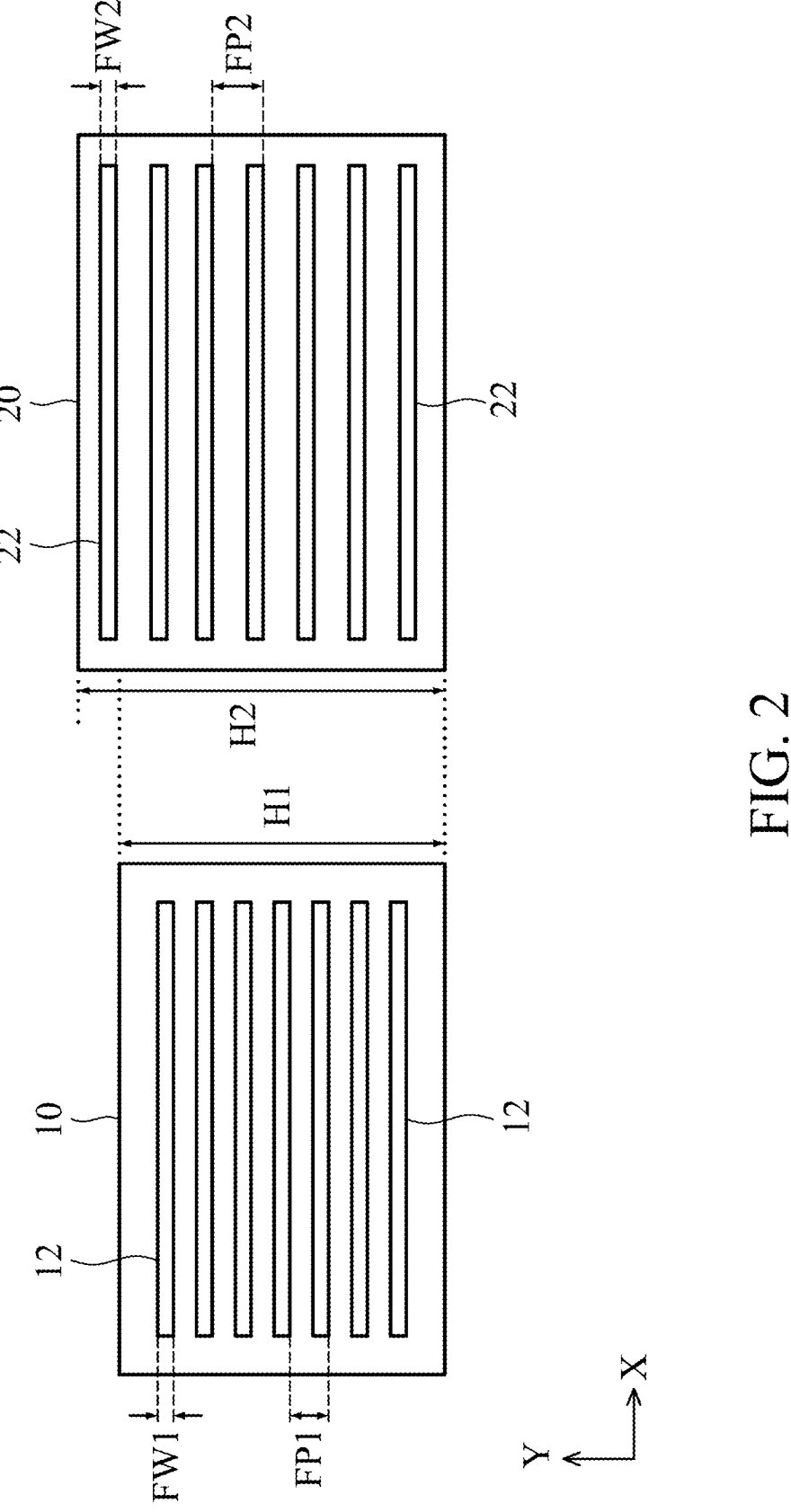
FIG. 2 is a simplified diagram illustrating a first cell and a second cell with various cell heights of an IC according to some embodiments of the invention.

FIG. 2 is a simplified diagram illustrating a first cell 10 and a second cell 20 with various cell heights of an IC according to some embodiments of the invention. The first cell 10 has a cell height H1 and the second cell 20 has a cell height H2 in the Y direction, and the cell height H2 is greater than the cell height H1, i.e., H2>H1. Furthermore, each of the first cells 10 and the second cells 20 includes a plurality of transistors. In some embodiments, the transistors are selected from a group consisting of planar transistors, fin field effect transistors (FinFETs), vertical gate all around (GAA), horizontal GAA, nano wire, nano sheet, or a combination thereof.

In FIG. 2, the transistors in the first cell 10 are formed by multiple fins 12 that extend in the Y direction, and the transistors in the second cell 20 are formed by multiple fins 22 that extend in the Y direction. In such embodiment, the fin width FW1 of the fins 12 in the first cell 10 is equal to the fin width FW2 of the fins 22 in the second cell 20, i.e., FW1=FW2. Furthermore, the fin pitch FP1 of the fins 10 is different from the fin pitch FP2 of the fins 20. For example, the fin pitch FP2 is greater than the fin pitch FP1, i.e., FP2>FP1.

In some embodiments, the fin width FW1 of the fins 12 in the first cell 10 is different from the fin width FW2 of the fins 22 in the second cell 20. For example, the width FW1 is less than the width FW2 (i.e., FW1<FW2). In some embodiments, the fin pitch FP1 of the fins 12 is equal to the fin pitch FP2 of the fins 22. Moreover, the number of fins 12 in the first cell 10 may be equal to or different from the number of fins 22 in the second cell 20.

Figure 3:
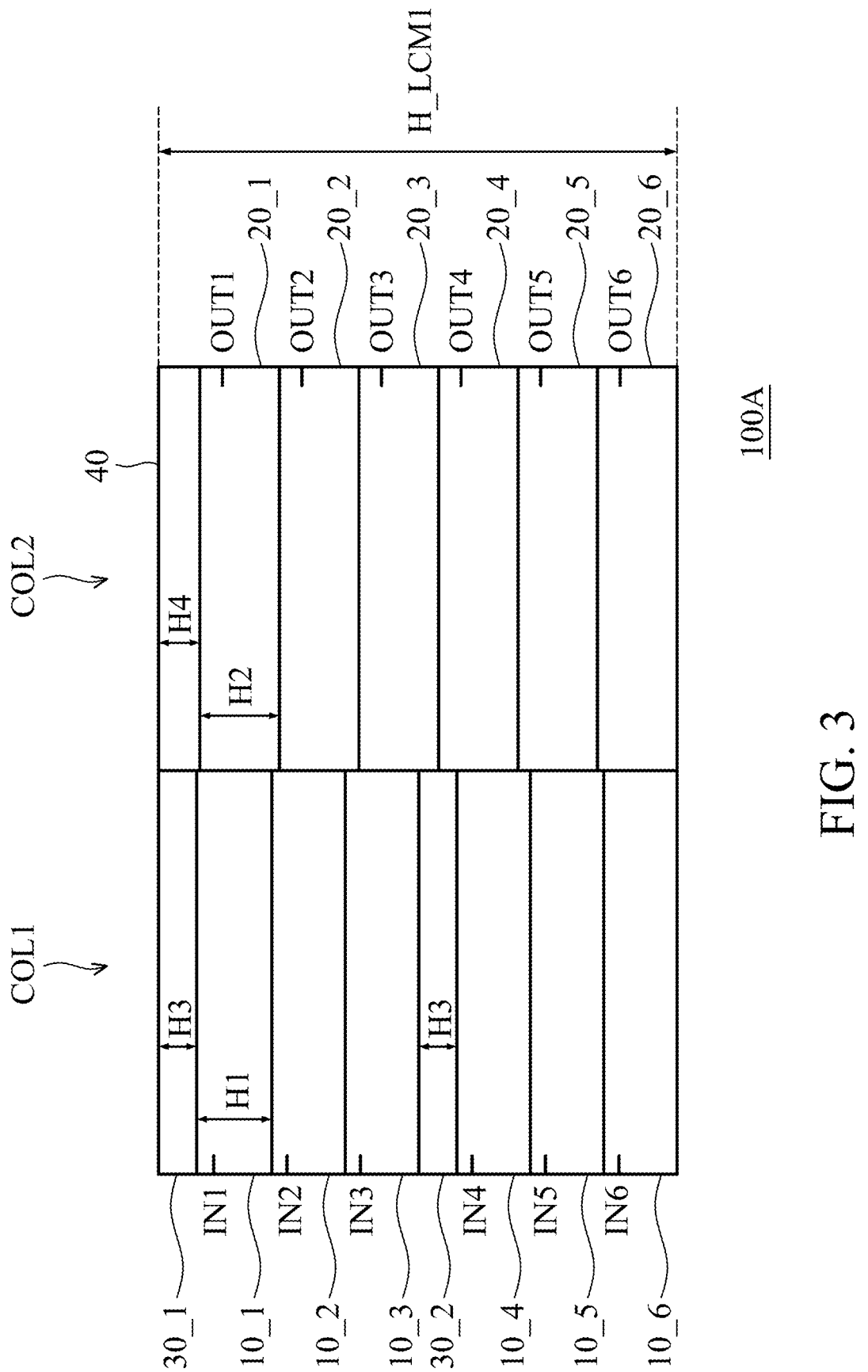
FIG. 3 is a simplified diagram illustrating a cell array with hybrid cell height according to some embodiments of the invention.

FIG. 3 is a simplified diagram illustrating a cell array 100A with hybrid cell height according to some embodiments of the invention. The cell array 100A includes the first cells 10_1 through 10_6 arranged in the first column COL1 and the second cells 20_1 through 20_6 arranged in the second column COL2 that is abutting the first column COL 1. As described above, the cell height H1 of the first cells 10_1 through 10_6 is less than the cell height H2 of the second cells 20_1 through 20_6. Furthermore, the fin pitch FP1 of the first cells 10 1 through 10_6 is different from the fin pitch FP2 of the second cells 20_1 through 20_6. Moreover, the first cells 10_1 through 10_6 and the second cells 20_1 through 20_6 may be the digital cells or analog cells. In some embodiments, the cell height H1 is in the range from about 130 nm to about 410 nm, and the cell height H2 is in the range from about 280 nm to about 420 nm.

In FIG. 3, the cell array 100A has an array height H_LCM1 (e.g., 3.64 μm), and the array height H_LCM1 is determined according to the cell height H1 and the cell height H2. In some embodiments, the array height H_LCM1 is the least common multiple (LCM) of the cell height H1 and the cell height H2. For example, if the cell height H1 is 260 nm and the cell height H2 is 280 nm, the array height H_LCM1 is the LCM of 260 nm and 280 nm, i.e., 3.64 μm.

In some embodiments, the array height H_LCM1 is the multiple of the LCM of the cell height H1 and the cell height H2.

In the cell array 100A, each of the first cells 10_1 through 10_6 is a core device configured to perform a first function. Furthermore, the first cells 10_1 through 10_6 have the same circuit configuration. Similarly, each of the second cells 20_1 through 20_6 is an input/output (I/O) device configured to perform a second function. Furthermore, the second cells 20_1 through 20_6 have the same circuit configuration.

In the cell array 100A, each first cell 10 in the first column COL1 corresponds to respective second cell 20 in the second column COL2, and each first cell 10 is coupled to the corresponding second cell 20 so as to perform the first function and the second function on an input signal to provide an output signal. For example, the first cell 10_1 is configured to perform the first function on an input signal IN1 to generate at least one intermediate signal to the second cell 20_1. In respond to the intermediate signal, the second cell 20_1 is configured to perform the second function on the intermediate signal to provide an output signal OUT1. Thus, the output signal OUT1 is obtained according to the input signal IN1 through a signal path between the first cell 10_1 and the second cell 20_1. Similarly, the first cell 10_3 is configured to perform the first function on an input signal IN3 to generate at least one intermediate signal to the second cell 20_3. In respond to the intermediate signal, the second cell 20_3 is configured to perform the second function on the intermediate signal to provide an output signal OUT3. Thus, the output signal OUT3 is obtained according to the input signal IN3 through a signal path between the first cell 10_3 and the second cell 20_3. Specifically, the output signals OUT1 through OUT6 are obtained according to the input signals IN1 through IN6 through the different signal paths in the cell array 100A.

In the cell array 100A, each of the second cells 20_1 through 20_6 is coupled to and in contact with the corresponding first cell 10. For example, the second cell 20_1 is coupled to and in contact with the first cell 10_1, the second cell 20_2 is coupled to and in contact with the first cell 10_2, the second cell 20_3 is coupled to and in contact with the first cell 10_3, and so on.

In the cell array 100A, the array height H_LCM1 is only enough for six second cells 20, not enough for seven second cells 20, thus a fourth cell (i.e., an additional cell) 40 having a cell height H4 is inserted in the second column COL2. In such embodiment, the fourth cell 40 is abutting the second cell 20_1. Furthermore, the cell height H4 is half of the cell height H2. The fourth cell 40 is configured to perform a function that is different from the first function of the first cell 10 and the second function of the second cell 20. In some embodiment, the fourth cell 40 is a dummy cell or a guard ring cell. In some embodiments, the fourth cell 40 is configured to perform a specific function of a specific circuit different from a circuit including the first cells 10_1 through 10_6 and the second cells 20_1 through 20_6.

In order to meet the number of second devices 20 that can be placed in the second column COL2, only six first devices 10 are arranged in the first column COL1. Thus, the third cells (i.e., the additional cells) 30_1 and 30_2 having the cell height H3 are inserted into the first column COL1. Furthermore, the cell height H3 is half of the cell height H1. In such embodiment, the third cell 30_1 is abutting the first cell 10_1 (e.g., the top of the column COL1), and the third cell 30_2 is abutting the first cells 10_3 and 10_4 (e.g., the middle of the column COL1). Each of the third cells 30_1 and 30_2 is configured to perform a function that is different from the first function of the first cell 10 and the second function of the second cell 20. In some embodiment, each third cell 30 is a dummy cell or a guard ring cell. In some embodiments, the third cell 30 is configured to perform a specific function of a specific circuit different from a circuit including the first cells 10_1 through 10_6 and the second cells 20_1 through 20_6.

In the cell array 100A, the third cells 30_1 and 30_2 function as the filler cells in the first column COL1, and the fourth cell 40 function as the filler cells in the second column COL2. Thus, no gap (i.e., the empty space) is present in the first column COL1 and the second column COL2, thereby avoiding DRC violations caused by the empty space.

Figure 4A:
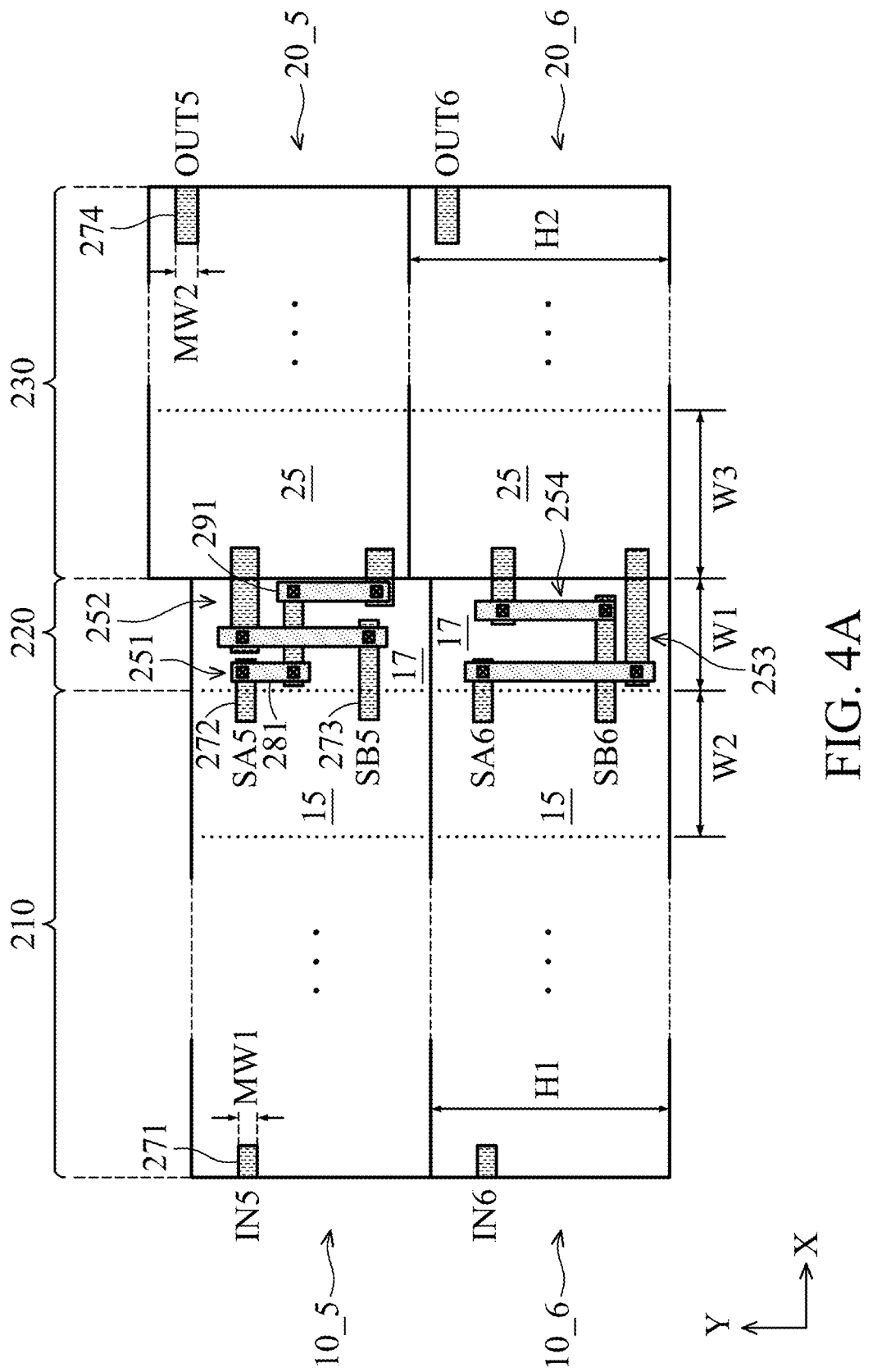
FIG. 4A is a simplified diagram illustrating the first cells and the second cells of the cell array in FIG. 3 according to some embodiments of the invention.

FIG. 4A is a simplified diagram illustrating the first cells 10_5 and 10_6 and the second cells 20_5 and 20_6 of the cell array 100A in FIG. 3 according to some embodiments of the invention. Each of the first cells 10_5 and 10_6 includes a plurality of device units 15 and a routing unit 17. In each first cell 10, the device units 15 and the routing unit 17 have the cell height H1 and are arranged in the same row. Furthermore, the device units 15 may have the same or different circuit configuration for perform various operations, and the device units 15 in the same row are configured to perform the first function for the first cell 10. Similarly, each of the second cells 20_5 and 20_6 includes a plurality of device units 25. For each second cell 20, the device units 25 have the cell height H2 and are arranged in the same row. Furthermore, the device units 25 may have the same or different circuit configuration for perform various operations, and the device units 25 in the same row are configured to perform the second function for the second cell 20.

In FIG. 4A, the device units 15 are disposed in a device range 210 and the routing unit 17 is disposed in a routing range 220 in each first cell 10. Moreover, the device units 25 are disposed in a device range 230 in each second cell 20. The device range 210 is separated from the device range 230 by the routing range 220. In other words, the device units 15 are separated from the device units 25 by the routing units 17. In some embodiments, no transistor is formed in the routing units.

The routing unit 17 has a unit width W1 in the X direction. The device unit 15 has a unit width W2 in the X direction, and the unit width W2 is greater than the unit width W1, i.e., W2>W1. The device unit 25 has a unit width W3 in the X direction, and the unit width W3 is also greater than the unit width W1, i.e., W3>W1. In some embodiments, the device units 15 arranged in the same row and corresponding to different operations may have different unit widths, and the device units 25 arranged in the same row and corresponding to different operations may have different unit widths. In some embodiments, the device units 15 arranged in the same row and corresponding to the same operations may have the same unit width, and the device units 25 arranged in the same row and corresponding to the same operations may have the same unit width.

In FIG. 4A, the first cell 10_5 is configured to perform the first function on an input signal INS to generate the intermediate signals SA5 and SB5 to the second cell 20_5. After receiving the intermediate signals SA5 and SB5, the second cell 20_5 is configured to perform the second function on the intermediate signals SA5 and SB5 so as to provide an output signal OUTS. Thus, the output signal OUTS is obtained according to the input signal INS through a signal path between the first cell 10_5 and the second cell 20_5, and the signal path is formed by the interconnect structures of the device range 210, the routing range 220 and the device range 230. For example, the intermediate signal SA5 is provided to the second cell 20_5 through the interconnect structure 251 of the routing cell 17, and the intermediate signal SB5 is provided to the second cell 20_5 through the interconnect structure 252 of the routing cell 17.

In the device units 15 of the first cell 10_5, the input signal INS is received through a metal line 271, and the intermediate signals SA5 and SB5 are provided to the interconnect structures 251 and 252 through the metal lines 272 and 273, respectively. Moreover, the output signal OUTS is provided through a metal line 274 in the device units 25 of the second cell 20_5. In such embodiments, the metal lines 271 through 274 are formed in a first metal layer. In some embodiments, the metal lines 271 through 274 are formed in various metal layers. In some embodiments, the metal lines in the first cell 10_5 and the second cell 20_5 have different metal widths. For example, a metal width MW1 of the metal line 271 in the first cell 10_5 is less than a metal width MW2 of the metal line 274 in the second cell 20_5. Furthermore, the interconnect structures 251 and 252 are formed by the metal lines in the first metal layer, the metal lines (e.g., 281) in a second metal layer over the first metal layer, and the corresponding vias (e.g., 291) in a via layer between the first and second metal layers. It should be noted that the configurations of the interconnect structures 251 and 252 are used as an example, and not to limit the invention.

Similarly, the first cell 10_6 is configured to perform the first function on an input signal IN6 to generate the intermediate signals SA6 and SB6 to the second cell 20_6. After receiving the intermediate signals SA6 and SB6, the second cell 20_6 is configured to perform the second function on the intermediate signals SA6 and SB6 to provide an output signal OUT6. Thus, the output signal OUT6 is obtained according to the input signal IN6 through a signal path between the first cell 10_6 and the second cell 20_6, and the signal path is formed by the interconnect structures of the device range 210, the routing range 220 and the device range 230. For example, the intermediate signal SA6 is provided to the second cell 20_6 through the interconnect structure 253 of the routing cell 17, and the intermediate signal SB6 is provided to the second cell 20_6 through the interconnect structure 254 of the routing cell 17.

Since the cell height H1 is different from the cell height H2, the first cell 10_5 will not align with the second device 20_5, and the first cell 10_6 will not align with the second device 20_6. Thus, the routing cells 17 of two adjacent first cells 10 in the column COL1 have different interconnect structures. For example, the interconnect structures (e.g., 251 and 252) of the routing cell 17 in the first cell 10_5 are different from the interconnect structures (e.g., 253 and 254) of the routing cell 17 in the first cell 10_6, as shown in FIG. 4A.

Figure 4B:
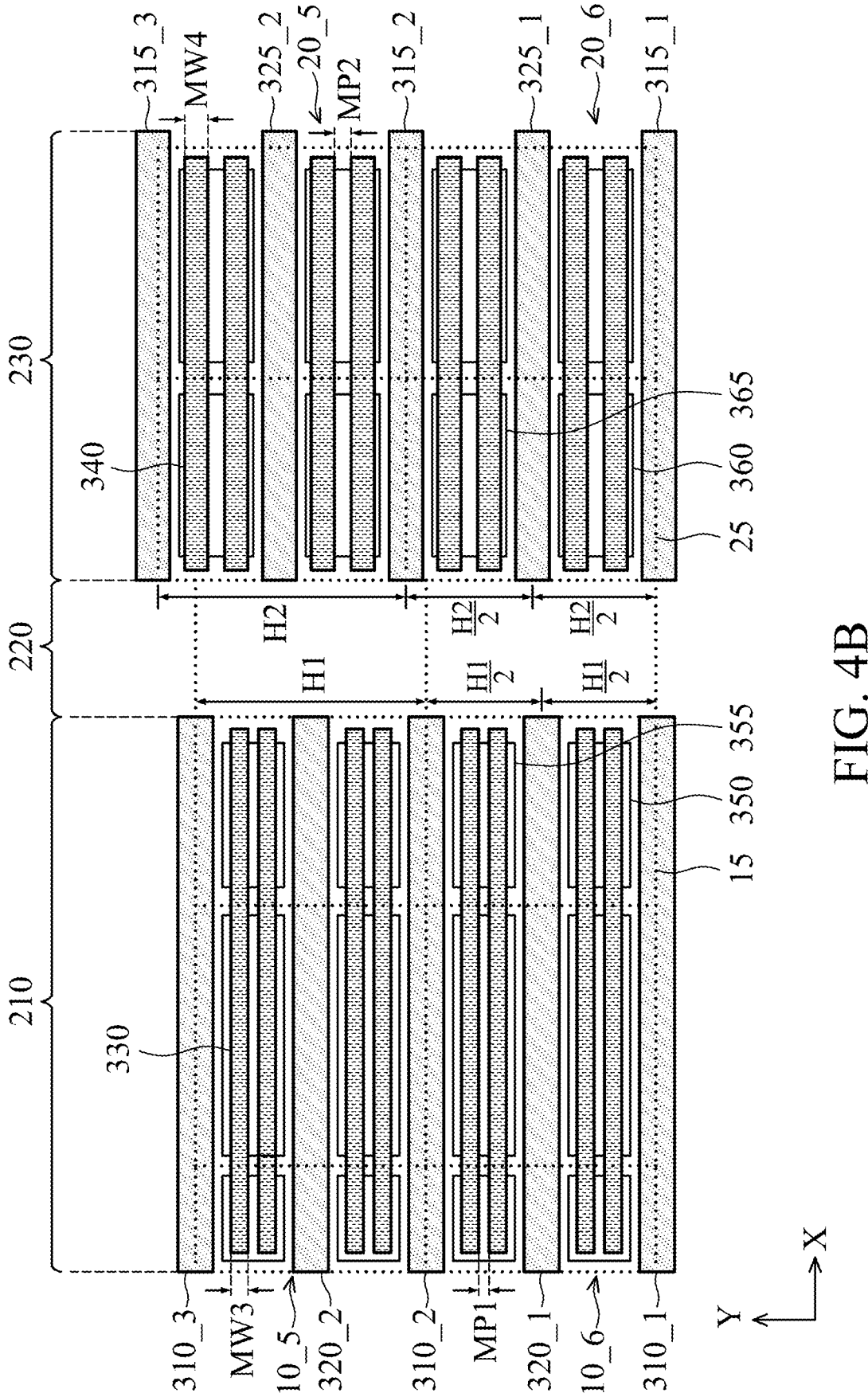
FIG. 4B is a simplified diagram illustrating the device units of the first cell and the device units of the second cell in FIG. 4A according to some embodiments of the invention.

FIG. 4B is a simplified diagram illustrating the device units 15 of the first cell 10 and the device units 25 of the second cell 10 in FIG. 4A according to some embodiments of the invention.

In the device range 210 of the first cells 10_5 and 10_6, the power lines 310 and 320 extend along the X direction and are arranged alternately. The power lines 310 and the power lines 320 are configured to connect various power signals. For example, when a power voltage (e.g., VDD) is applied to the power lines 310, the power lines 320 are grounded. On the contrary, when a power voltage (e.g., VDD) is applied to the power lines 320, the power lines 310 are grounded.

In the first cell 10_6, the power lines 310_1 and 310_2 are disposed on the lower and upper sides of the first cell 10_6, respectively, and the power line 320_1 is disposed between the power lines 310_1 and 310_2. Moreover, in the first cell 10_5, the power lines 310_2 and 310_3 are disposed on the lower and upper sides of the first cell 10_5, respectively, and the power line 320_2 is disposed between the power lines 310_2 and 310_3. In such embodiment, a pitch of the power lines 310 is equal to a pitch of the power lines 320. For example, a distance between the power lines 310_1 and 310_2 is equal to the cell height H1, and a distance between the power lines 320_1 and 320_2 is also equal to the cell height H1. Moreover, in the first cell 10_6, a distance between the power line 310_1 and the power line 320_1 and a distance between the power line 320_1 and the power line 310_2 are equal to half of the cell height H1, i.e., the cell height H3. Similarly, in the first cell 10_5, a distance between the power line 310_2 and the power line 320_2 and a distance between the power line 320_2 and the power line 310_3 are equal to half of the cell height H1.

In the device range 230 of the second cells 20_5 and 20_6, the power lines 315 and 325 extend along the X direction and are arranged alternately. The power lines 315 and the power lines 325 are configured to connect various power signals. For example, when a power voltage (e.g., VDD) is applied to the power lines 315, the power lines 325 are grounded. On the contrary, when a power voltage (e.g., VDD) is applied to the power lines 325, the power lines 315 are grounded.

In the second cell 20_6, the power lines 315_1 and 315_2 are disposed on the lower and upper sides of the second cell 20_6, respectively, and the power line 325_1 is disposed between the power lines 315_1 and 315_2. Moreover, in the second cell 20_5, the power lines 315_2 and 315_3 are disposed on the lower and upper sides of the second cell 20_6, respectively, and the power line 325_2 is disposed between the power lines 315_2 and 315_3. In such embodiment, a pitch of the power lines 315 is equal to a pitch of the power lines 325. For example, a distance between the power lines 315_1 and 315_2 is equal to the cell height H2, and a distance between the power lines 325_1 and 325_2 is also equal to the cell height H2. Furthermore, in the second cell 20_6, a distance between the power line 315_1 and the power line 325_1 and a distance between the power line 325_1 and the power line 315_2 are equal to half of the cell height H2, i.e., the cell height H4. Similarly, in the second cell 20_5, a distance between the power line 315_2 and the power line 325_2 and a distance between the power line 325_2 and the power line 315_3 are equal to half of the cell height H2.

In FIG. 4B, the power lines 310 and 320 and the power lines 315 and 325 are formed in the same metal layer. Moreover, the power lines 310 and 320 and the power lines 315 and 325 have the same width in the Y direction. In some embodiments, the width of the power lines 310 and 320 is different from the width of the power lines 315 and 325.

It should be noted that the configuration and arrangement of the power lines 310 and 320 and the power lines 315 and 325 are used as an example, and not to limit the invention. Taking the first cells 10_5 and 10_6 as an example, in some embodiments, multiple power lines 320 are arranged between two adjacent power lines 310, or multiple power lines 310 are arranged between two adjacent power lines 320. In some embodiments, the power line 310 is not equidistant from the two adjacent power lines 320. In some embodiments, the power lines 310 and 320 are formed in different layers. For example, the power lines 310 are formed in a first metal layer, and the power lines 320 are formed in a second metal layer over or under the first metal layer. Moreover, the power lines 310 of the first metal layer may overlay or not overlay the power lines 320 of the second metal layer.

In each device unit 15, a plurality of transistors are formed in an active region 350 between the bottom power line (e.g., 310_1) and the intermediate power line (e.g., 320_1), and a plurality of transistors are formed in an active region 355 between the intermediate power line (e.g., 320_1) and the top power line (e.g., 310_2). In each device unit 25, a plurality of transistors are formed in an active region 360 between the bottom power line (e.g., 315_1) and the intermediate power line (e.g., 325_1), and a plurality of transistors are formed in an active region 365 between the intermediate power line (e.g., 325_1) and the top power line (e.g., 315_2). In some embodiments, the transistors are FinFETs, and the fin width of the transistors in the device range 230 is greater than fin width of the transistors in the device range 210.

In each of the first cells 10_5 and 10_6, a plurality of metal lines 330 extending in the X direction are formed over the transistors of the device units 15. Furthermore, in each of the second cells 20_5 and 20_6, a plurality of metal lines 340 extending in the X direction are formed over the transistors of the device units 25. In FIG. 4B, the metal lines 330 and 340 are formed in the same metal layer. Moreover, the metal lines 330 in the device range 210 and the metal lines 340 in the device range 230 have different metal widths. For example, a metal width MW3 of the metal line 330 in the first cell 10_5 is less than a metal width MW4 of the metal line 340 in the second cell 20_5. Furthermore, the line pitch MP1 of the metal lines 330 is different from the line pitch MP2 of the metal lines 340. For example, the line pitch MP1 is less than the line pitch MP2, i.e., MP1<MP2.

Figure 5:
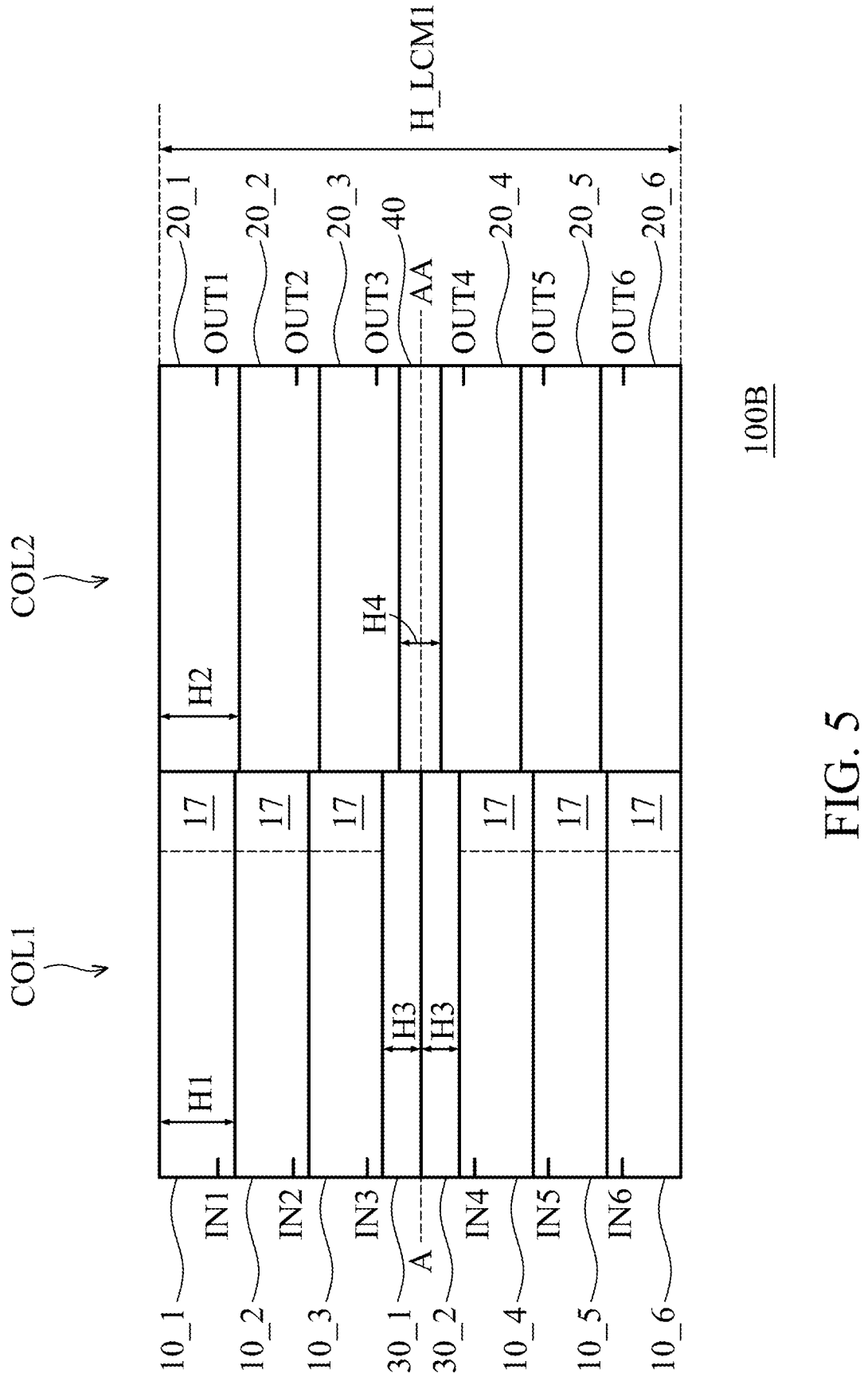
FIG. 5 is a simplified diagram illustrating a cell array with hybrid cell height according to some embodiments of the invention.

FIG. 5 is a simplified diagram illustrating a cell array 100B with hybrid cell height according to some embodiments of the invention. The cell array 100B includes the first cells 10_1 through 10_6 arranged in the first column COL1 and the second cells 20_1 through 20_6 arranged in the second column COL2 that is abutting the first column COL1. As described above, the cell height H1 of the first cells 10_1 through 10_6 is less than the cell height H2 of the second cells 20_1 through 20_6.

The cell array 100B has an array height H_LCM1 that is equal to the array height H_LCM1 of the cell array 100A in FIG. 3. Compared with the cell array 100A of FIG. 3, the third cells 30_1 and 30_2 having the cell height H3 are arranged in the middle of the first column COL1 and the fourth cell 40 having the cell height H4 is arranged in the middle of the second column COL2 in the cell array 100B of FIG. 5. Therefore, the cell array 100B has a symmetrical configuration in layout along line A-AA. In other words, the routing units 17 and the device units 15 of the first cells 10_1 and 10_6 are mirrored along the line A-AA, the routing units 17 and the device units 15 of the first cells 10_2 and 10_5 are mirrored along the line A-AA, and the routing units 17 and the device units 15 of the first cells 10_3 and 10_4 are mirrored along the line A-AA. Similarly, the device units 25 of the second cells 20_1 and 20_6 are mirrored along the line A-AA, the device units 25 of the second cells 20_2 and 20_5 are mirrored along the line A-AA, and the device units 25 of the second cells 20_3 and 20_4 are mirrored along the line A-AA.

In some embodiments, a single power line 310 and a single power line 320 are disposed on the lower and upper sides of each of the third cells 30_1 and 30_2, respectively. Furthermore, a distance between the power lines 310 and 320 is equal to the cell height H3, i.e., half of the cell height H1. Similarly, a single power line 330 and a single power line 340 are disposed on the lower and upper sides of the fourth cell 40, respectively. Furthermore, a distance between the power lines 330 and 340 is equal to the cell height H4, i.e., half of the cell height H2.

In the cell array 100A of FIG. 3, the routing unit 17 in each of the first cells 10_1 through 10_6 has respective layout configuration due to the asymmetric arrangement of the first cells 10 and the second cells 20. Compared with the cell array 100A of FIG. 3, the cell array 100B of FIG. 5 has the symmetric arrangement of the first cells 10 and the second cells 20 along the line A-AA, thereby reducing layout costs and process complexity.

Figure 6:
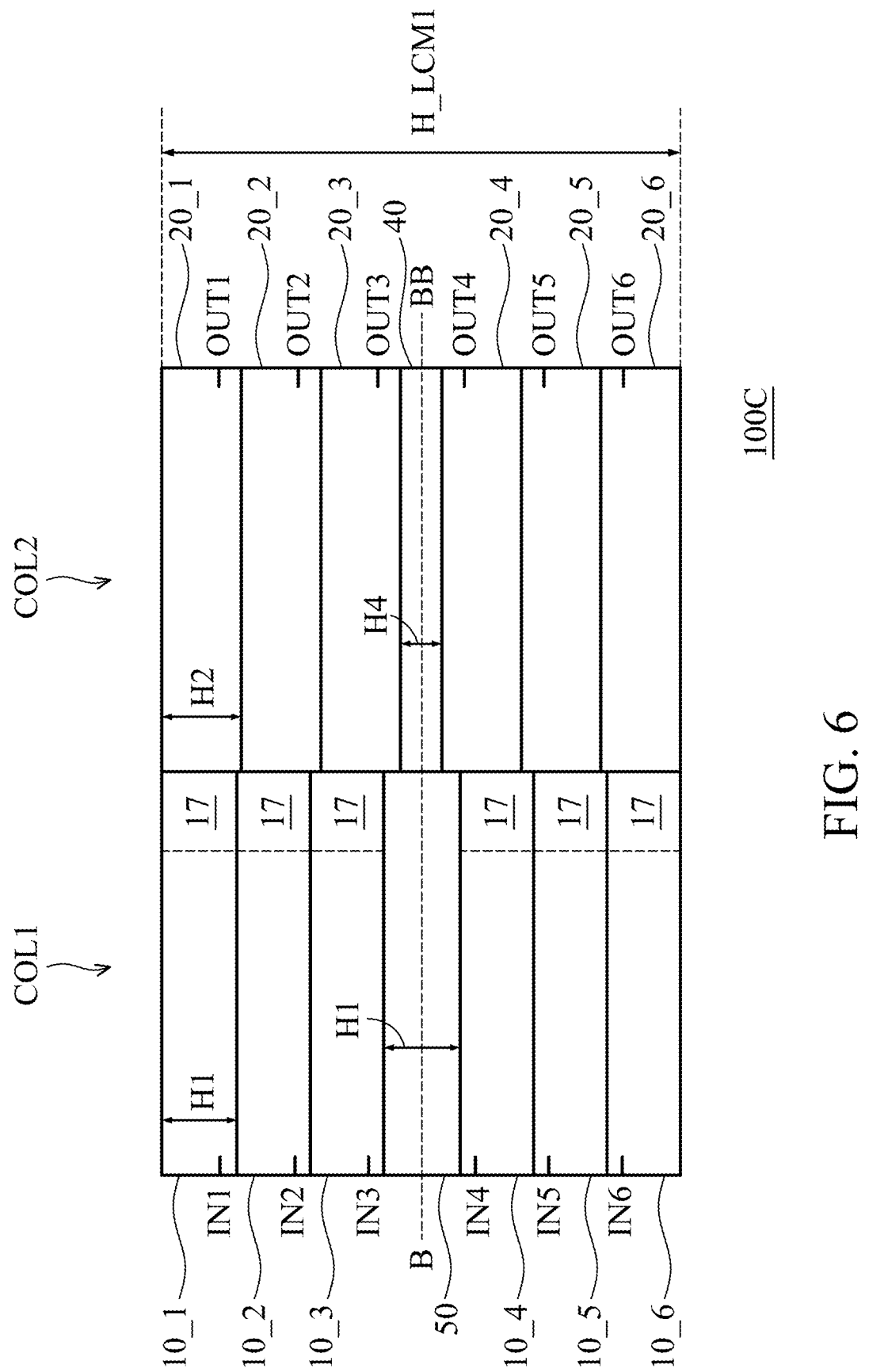
FIG. 6 is a simplified diagram illustrating a cell array with hybrid cell height according to some embodiments of the invention.

FIG. 6 is a simplified diagram illustrating a cell array 100C with hybrid cell height according to some embodiments of the invention. The cell array 100C includes the first cells 10_1 through 10_6 arranged in the first column COL1 and the second cells 20_1 through 20_6 arranged in the second column COL2 that is abutting the first column COL1. As described above, the cell height H1 of the first cells 10_1 through 10_6 is less than the cell height H2 of the second cells 20_1 through 20_6.

In FIG. 6, the configuration of the cell array 100C is similar to the configuration of the cell array 100B in FIG. 5. The difference between the cell array 100C of FIG. 6 and the cell array 100B of FIG. 5 is that the third cells 30_1 and 30_2 having the cell height H3 are replaced with a fifth cell 50 having the cell height H1. Furthermore, the cell array 100C has a symmetrical configuration in layout along line B-BB. In other words, the first cells 10_1 and 10_6 are mirrored along the line B-BB, the first cells 10_2 and 10_5 are mirrored along the line B-BB, and the first cells 10_3 and 10_4 are mirrored along the line B-BB. Similarly, the second cells 20_1 and 20_6 are mirrored along the line B-BB, the second cells 20_2 and 20_5 are mirrored along the line B-BB, and the second cells 20_3 and 20_4 are mirrored along the line B-BB.

The fifth cell 50 is configured to perform a function that is different from the first function of the first cell 10 and the second function of the second cell 20. In some embodiment, the fifth cell 50 is a dummy cell or a guard ring cell. In some embodiments, the fifth cell 50 is configured to perform a specific function of a specific circuit different from a circuit including the first cells 10_1 through 10_6 and the second cells 20_1 through 20_6.

In some embodiments, dual power lines 310 are disposed on the lower and upper sides of the fifth cell 50, and one power line 320 is disposed between the dual power lines 310. Furthermore, a distance from each power line 310 to the power line 320 is equal to half of the cell height H1.

Figure 7:
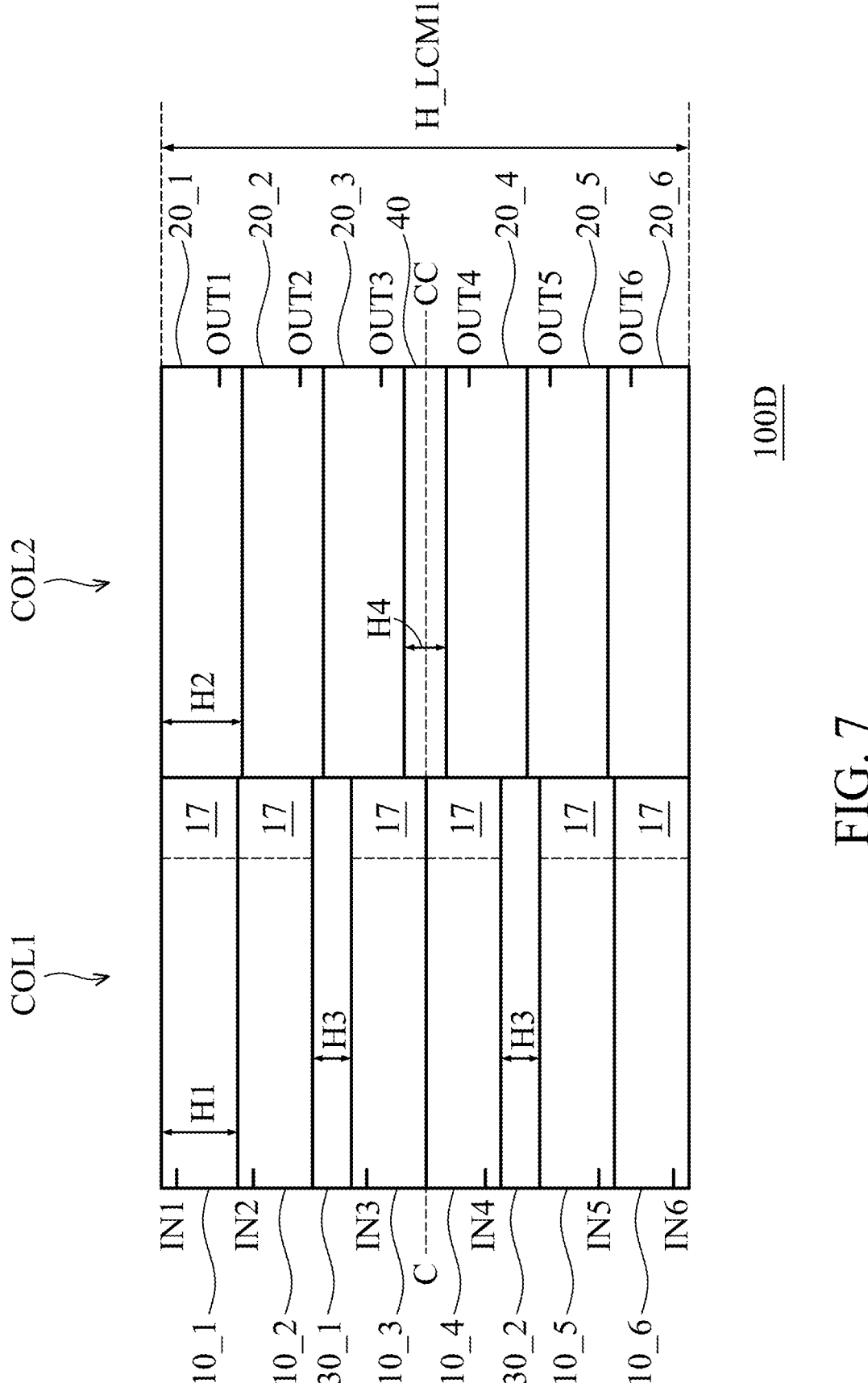
FIG. 7 is a simplified diagram illustrating a cell array with hybrid cell height according to some embodiments of the invention.

FIG. 7 is a simplified diagram illustrating a cell array 100D with hybrid cell height according to some embodiments of the invention. The cell array 100D includes the first cells 10_1 through 10_6 arranged in the first column COL1 and the second cells 20_1 through 20_6 arranged in the second column COL2 that is abutting the first column COL1. As described above, the cell height H1 of the first cells 10_1 through 10_6 is less than the cell height H2 of the second cells 20_1 through 20_6.

In FIG. 7, the configuration of the cell array 100D is similar to the configuration of the cell array 100B in FIG. 5. The difference between the cell array 100D of FIG. 7 and the cell array 100B of FIG. 5 is that the third cells 30_1 and 30_2 having the cell height H3 do not arranged in the middle of the first column COL1. In the first column COL1, the third cell 30_1 is inserted between the first cells 10_2 and 10_3, and the third cell 30_2 is inserted between the first cells 10_4 and 10_5. Similarly, the cell array 100D has a symmetrical configuration in layout along line C-CC. In other words, the first cells 10_1 and 10_6 are mirrored along the line C-CC, the first cells 10_2 and 10_5 are mirrored along the line C-CC, and the first cells 10_3 and 10_4 are mirrored along the line C-CC. Similarly, the second cells 20_1 and 20_6 are mirrored along the line B-BB, the second cells 20_2 and 20_5 are mirrored along the line B-BB, and the second cells 20_3 and 20_4 are mirrored along the line B-BB.

In some embodiments, the third cell 30_1 is inserted between the first cells 10_1 and 10_2, and the third cell 30_2 is inserted between the first cells 10_5 and 10_6 in the first column COL1.

Figure 8:
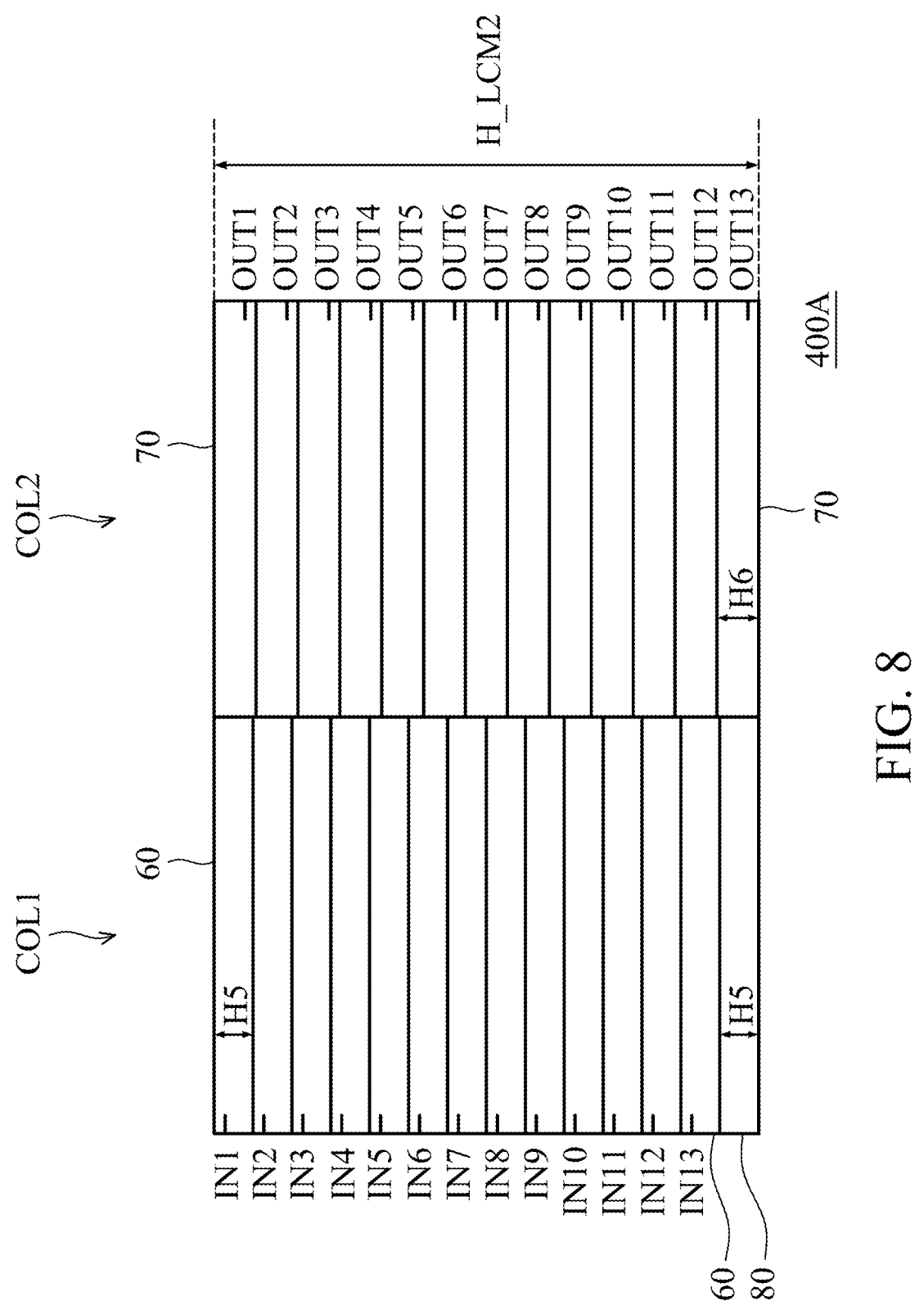
FIG. 8 is a simplified diagram illustrating a cell array with hybrid cell height according to some embodiments of the invention.

FIG. 8 is a simplified diagram illustrating a cell array 400A with hybrid cell height according to some embodiments of the invention. The cell array 400A includes the sixth cells 60 arranged in the first column COL1 and the seventh cells 70 arranged in the second column COL2 that is abutting the first column COL1. In such embodiments, the cell height H5 of the sixth cells 60 is less than the cell height H6 of the seventh cells 70. Furthermore, the fin pitch of fins in the sixth cell 60 is different from the fin pitch of fins in the seventh cell 70. For example, the fin pitch of the sixth cell 60 is less than the fin pitch of the seventh cell 70. In some embodiments, the cell height H5 is in the range from about 130 nm to about 410 nm, and the cell height H6 is in the range from about 280 nm to about 420 nm.

In FIG. 8, the cell array 400A has an array height H_LCM2, and the array height H_LCM2 is determined according to the cell height H5 and the cell height H6. In some embodiments, the array height H_LCM2 is the least common multiple (LCM) of the cell height H5 and the cell height H6. In some embodiments, the array height H_LCM2 is the multiple of the LCM of the cell height H5 and the cell height H6.

In the cell array 400A, the sixth cells 60 are core devices configured to perform a third function. Furthermore, the sixth cells 60 have the same circuit configuration. Similarly, the seventh cells 70 are input/output (I/O) devices configured to perform a fourth function. Furthermore, the seventh cells 70 have the same circuit configuration.

Each sixth cell 60 in the first column COL1 corresponds to respective seventh cell 70 in the second column COL2, and each sixth cell 60 is coupled to and in contact with the corresponding seventh cell 70, so as to perform the third function and the fourth function on an input signal to provide an output signal. Thus, the output signals OUT1 through OUT13 are obtained according to the input signals IN1 through IN13 through the different signal paths in the cell array 400A.

In the cell array 400A, the array height H_LCM2 can fit 13 seventh cells 70, thus no additional cells are needed to be inserted into the second column COL2. In order to meet the number of seventh cells 70 that can be placed in the second column COL2, only 13 sixth devices 60 are arranged in the first column COL1. Thus, an eighth cell 80 having the cell height H5 is inserted into the first column COL1.

In the cell array 400A, the eighth cell 80 functions as the filler cell in the first column COLI. Thus, no gap (i.e., the empty space) is present in the first column COL1, thereby avoiding DRC violations caused by the empty space.

Figure 9:
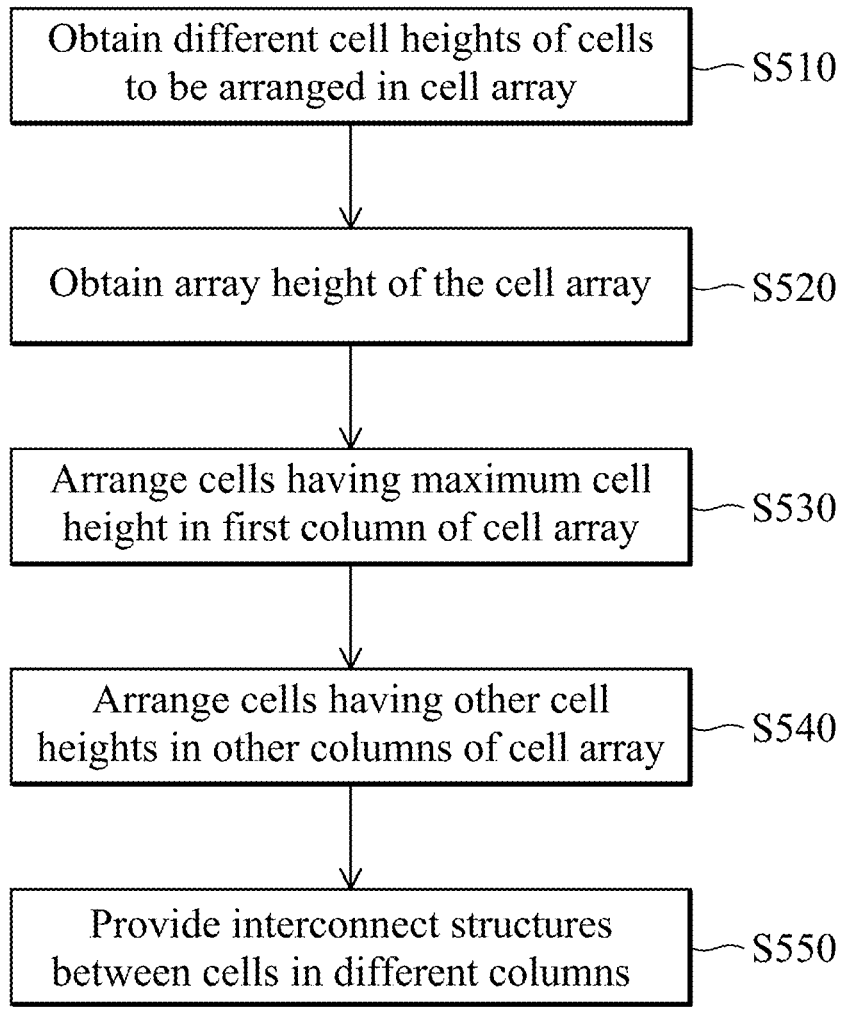
FIG. 9 is a flowchart of a method for providing a cell array with hybrid cell height according to an embodiment of the invention, wherein the method of FIG. 9 is performed by a computer capable of operating an electronic design automation (EDA) tool.

FIG. 9 is a flowchart of a method for providing a cell array with hybrid cell height according to an embodiment of the invention, wherein the method of FIG. 9 is performed by a computer capable of operating an electronic design automation (EDA) tool.

First, in step S510, the different cell heights of the cells to be arranged in the cell array are obtained, such as the cell height H1 of the first cell 10, the cell height H2 of the first cell 20, the cell height H5 of the sixth cell 60, and the height H6 of the seventh cell 70.

In step S520, the array height of the cell array is obtained according to the cell heights obtained in step S510. In some embodiments, the array height is the least common multiple (LCM) of the different cell heights. In some embodiments, the array height H_LCM1 is the multiple of the LCM of the different cell heights. In some embodiments, the array height H_LCM1 is an integer multiple of the LCM of the of the different cell heights.

In step S530, the cells having a maximum cell height are arranged in a first column of the cell array. The cells arranged in the first column have the same circuit configuration, and the cells are the same devices configured to perform the same function. Thus, the number of cells having the maximum cell height to be arranged in the first column is determined. If the array height is not an integer multiple of the maximum cell height, one or more additional cells are inserted in the first column to avoid the DRC violations caused by the empty space. As described above, the additional cell may be a dummy cell, a guard ring cell or a cell of other circuit.

In step S540, the cells having other cell heights are arranged in other columns of the cell array. For example, the cells having a first cell height are arranged in a second column of the cell array, and the first cell height is different from the maximum cell height. It should be noted that the number of cells having the first cell height in the second column is equal to the number of cells having the maximum cell height in the first column. In some embodiments, the cells having a second cell height are arranged in a third column of the cell array, and the second cell height is different from the maximum cell height and the first cell height. Moreover, the number of cells having the second cell height in the second column is equal to the number of cells having the maximum cell height in the first column. As described above, if the array height of the cell array is not an integer multiple of the first or second cell height, one or more additional cells are inserted in the corresponding column to avoid the DRC violations caused by the empty space.

In step S550, the interconnect structures between the cells in different columns are provided. In some embodiments, the interconnect structures are arranged in the specific cells having the cell height less than the maximum cell height and arranged in the same column. As described above, the interconnect structures are arranged in the routing units 17 of the specific cells.

After the interconnect structures and the cells having the different cell heights are placed in the cell array, the cell array may has a asymmetrical configuration (e.g., the cell array 100A of FIG. 3 and the cell array 400A of FIG. 8) or a symmetrical configuration (e.g., the cell array 100B of FIG. 5, the cell array 100C of FIG. 6 and the cell array 100D of FIG. 7) in layout.

Figure 10:
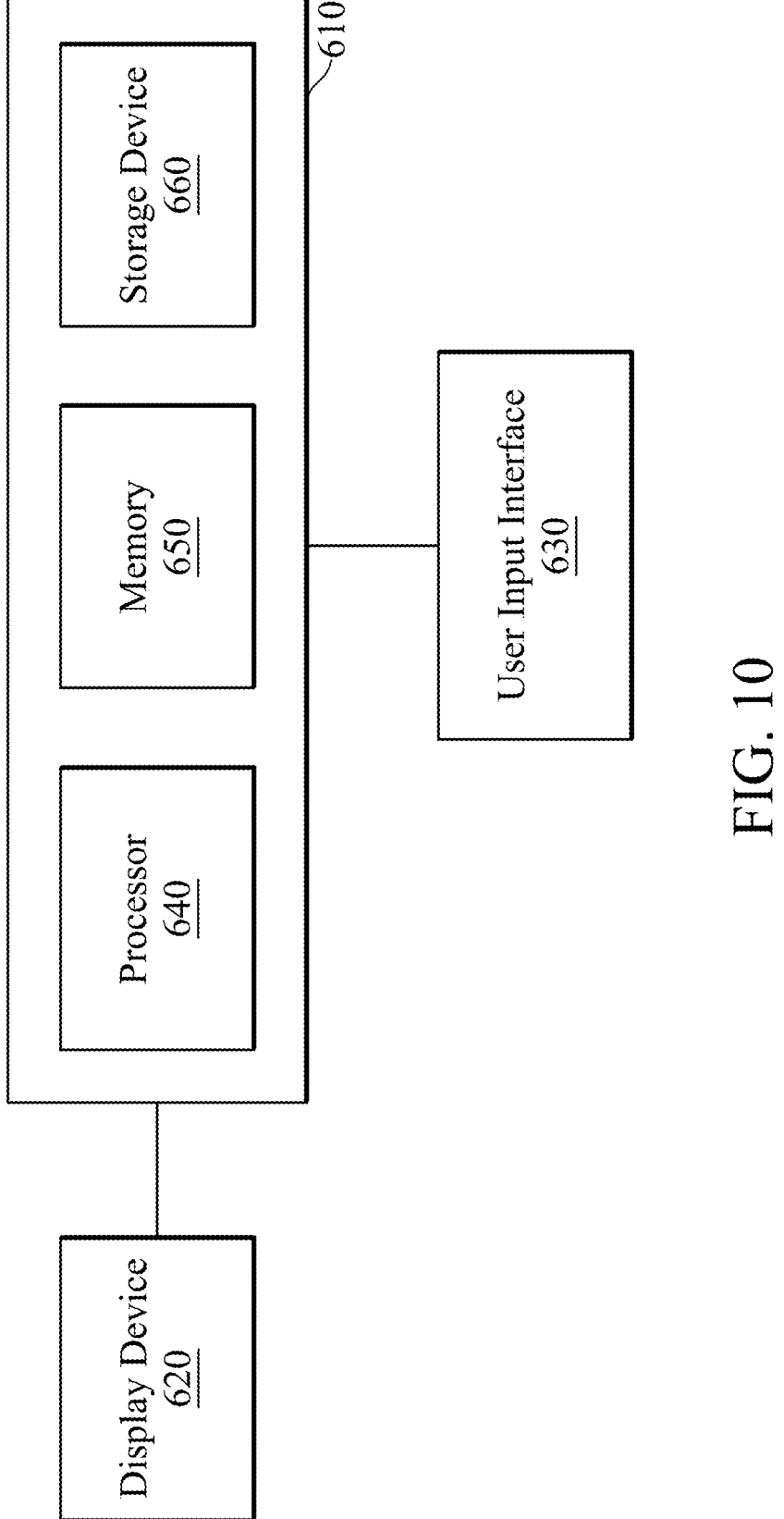
FIG. 10 shows a computer system according to an embodiment of the invention.

FIG. 10 shows a computer system 600 according to an embodiment of the invention. The computer system 600 comprises a computer 610, a display device 620 and a user input interface 630, wherein the computer 610 comprises a processor 640, a memory 650, and a storage device 660. The computer 610 is coupled to the display device 620 and the user input interface 630, wherein the computer 610 is capable of operating an electronic design automation (EDA) tool. Furthermore, the computer 610 is capable of receiving input instructions or information (e.g. timing constraints, RTL code, or interface information of the memory device) from the user input interface 630 and displaying simulation results, the layout of the IC and the blocks or circuits of the layout on the display device 620. In some embodiments, the display device 620 is a GUI for the computer 610. Furthermore, the display device 620 and the user input interface 630 can be implemented in the computer 610. The user input interface 630 may be a keyboard, a mouse, and so on. In the computer 610, the storage device 660 can store the operating systems (OSs), applications, information (e.g. circuit function information and power-related information) and data that comprise input required by the applications and/or output generated by applications. The processor 640 of the computer 610 can perform one or more operations (either automatically or with user input) in any method that is implicitly or explicitly described in this disclosure. For example, during an operation, the processor 640 can load the applications of the storage device 660 into the memory 650, and then the applications can be used by the user to create, view, and/or edit a placement, a floor plan and a physical layout for a circuit design (e.g., the cell array with hybrid cell height).

The data structures and code described in this disclosure can be partially or fully stored on a computer-readable storage medium and/or a hardware module and/or hardware apparatus. A computer-readable storage medium may be, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data. Examples of hardware modules or apparatuses described in this disclosure include, but are not limited to, application-specific integrated circuits (ASICs), field-programmable gate arrays (FPGAs), dedicated or shared processors, and/or other hardware modules or apparatuses now known or later developed.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor structure, comprising:
a cell array, comprising:
    a plurality of first cells arranged in a first column, each having a first cell height along a first direction and configured to perform a first function;
    a plurality of second cells arranged in a second column abutting the first column, each having a second cell height along the first direction and configured to perform a second function; and
    at least one third cell arranged in the first column, having a third cell height along the first direction and configured to perform a third function that is different from the first function and the second function, wherein along the first direction, a first side of the third cell is abutting a side of one of two of the first cells adjacent to each other, a second side of the third cell is abutting a side of the other of the two of the first cells adjacent to each other, and the second side of the third cell is opposite to the first side of the third cell;
wherein each of the second cells is coupled to and directly in contact with a respective first cell, and configured to receive at least one signal from the respective first cell and provide an output signal according to the received signal,
wherein the second cell height is greater than the first cell height, and the number of the first cells is equal to that of the second cells,
wherein the third cell height is half of the first cell height.

2. The semiconductor structure as claimed in claim 1, wherein each of the first and second cells comprises:
a power line extending along a second direction wherein the second direction is perpendicular to the first direction, and the first direction is parallel to the first column and the second column;
a ground line extending along the second direction;
a plurality of transistors disposed between the power line and the ground line and configured to perform the first or second function; and
a plurality of metal lines extending along the second direction and over the transistors.

3. The semiconductor structure as claimed in claim 2, wherein the power lines and the ground lines in the first and second cells have the same width.

4. The semiconductor structure as claimed in claim 2, wherein the metal lines in the first cells are narrower than the metal lines in the second cells.

5. The semiconductor structure as claimed in claim 1, wherein the third cell is a dummy cell or a guard ring cell.

6. The semiconductor structure as claimed in claim 1, wherein each of the first cells comprises a plurality of device units and a routing unit arranged in the same row, wherein the device units are configured to perform the first function so as to generate the signal, and the routing unit comprises at least one interconnect structure that is configured to transmit the signal to the second cell.

7. The semiconductor structure as claimed in claim 6, wherein in the first column, the interconnect structures of the routing units of two adjacent first cells are different.

8. The semiconductor structure as claimed in claim 6, wherein a unit width of the device unit is greater than a unit width of the routing unit.

9. A semiconductor structure, comprising:
a cell array, comprising:
    a plurality of first cells arranged in a first column, each having a first cell height along a first direction and configured to perform a first function;
    a plurality of second cells arranged in a second column abutting the first column, each having a second cell height along the first direction and configured to perform a second function;
    at least one third cell arranged in the first column, having a third cell height along the first direction and configured to perform a third function that is different from the first function, wherein along the first direction, a first side of the third cell is abutting a side of one of two of the first cells adjacent to each other, a second side of the third cell is abutting a side of the other of the two of the first cells adjacent to each other, and the second side of the third cell is opposite to the first side of the third cell; and
    at least one fourth cell arranged in the second column, having half of the second cell height along the first direction and configured to perform a fourth function that is different from the second function, wherein along the first direction, a first side of the fourth cell is abutting a side of one of two of the second cells adjacent to each other, a second side of the fourth cell is abutting a side of the other of the two of the second cells adjacent to each other, and the second side of the fourth cell is opposite to the first side of the fourth cell, wherein each of the first cells is coupled to and directly in contact with a respective second cell, and configured to provide at least one signal to the respective second cell according to an input signal, wherein the second cell height is greater than the first cell height, and the number of the first cells is equal to that of the second cells, wherein the third cell height is half of the first cell height.

10. The semiconductor structure as claimed in claim 9, wherein each of the first and second cells comprises:

a first power line extending along a second direction that is perpendicular to the first direction;

a second power line extending along the second direction;

a third power line extending along the second direction and disposed between the first and second power lines;

a plurality of transistors disposed between the first and third power lines and between the second and third power lines and configured to perform the first or second function; and a plurality of metal lines extending along the second direction and over the transistors, wherein when a power voltage is applied to the first and second power lines, the third power line is grounded, and when the power supply is applied to the third power line, the first and second power lines are grounded.

11. The semiconductor structure as claimed in claim 10, wherein the first, second and third power lines in the first and second cells have the same width.

12. The semiconductor structure as claimed in claim 10, wherein the metal lines in the first cells are narrower than the metal lines in the second cells.

13. The semiconductor structure as claimed in claim 9, wherein each of the third and fourth cells is a dummy cell or a guard ring cell.

14. The semiconductor structure as claimed in claim 9, wherein each of the first cells comprises a plurality of device units and a routing unit arranged in the same row, wherein the device units are configured to perform the first function so as to generate the signal, and the routing unit comprises at least one interconnect structure that is configured to transmit the signal to the second cell.

15. The semiconductor structure as claimed in claim 9, wherein the third cell is disposed in the middle of the first column and the fourth cell is disposed in the middle of the second column, wherein the third cell of the first column abuts the fourth cell in the second column.

16. A method for providing a cell array, comprising:

obtaining a first cell height of a plurality of first cells and a second cell height of a plurality of second cells along a first direction, wherein the second cell height is greater than the first cell height;

obtaining an array height of the cell array according to a least common multiple of the first cell height and the second cell height;

arranging the second cells in a first column of the cell array;

arranging the first cells in a second column of the cell array, wherein the number of first cells arranged in the second column is equal to the number of second cells arranged in the first column, and each of the second cells is coupled to and directly in contact with a respective first cell; and arranging at least one first additional cell having a third cell height along the first direction in the second column of the cell array, wherein along the first direction, a first side of the first additional cell is abutting a side of one of two of the first cells adjacent to each other a second side of the first additional cell is abutting a side of the other of the two of the first cells adjacent to each other, and the second side of the first additional cell is opposite to the first side of the first additional cell, wherein each of the first cells is configured to perform a first function and each of the second cells is configured to perform a second function that is different from the first function, wherein the third cell height is half of the first cell height, wherein each of the first cells comprises an interconnect structure configured to couple to and in contact with a respective second cell.

17. The method as claimed in claim 16, wherein the first additional cell is a dummy cell or a guard ring cell.

18. The method as claimed in claim 16, wherein in the second column, the interconnect structures of two adjacent first cells are different.

19. The method as claimed in claim 16, wherein each of the first and second cells comprises:

a power line;

a ground line parallel to the power line;

a plurality of transistors disposed between the power line and the ground line and configured to perform the first or second function; and a plurality of metal lines parallel to the power line and over the transistors.

20. The method as claimed in claim 19, wherein the power lines and the ground lines in the first and second cells have the same width, and the metal lines in the first cells are narrower than the metal lines in the second cells.

* * * * *